United States Patent
McCleland et al.

(10) Patent No.: US 9,942,629 B2
(45) Date of Patent: *Apr. 10, 2018

(54) METHODS OF SENSING PARAMETERS

(71) Applicants: Barry John McCleland, Southlake, TX (US); Eugene Christiaan van Beljon, Grapevine, TX (US)

(72) Inventors: Barry John McCleland, Southlake, TX (US); Eugene Christiaan van Beljon, Grapevine, TX (US)

(*) Notice: Subject to any disclaimer, the term of this patent is extended or adjusted under 35 U.S.C. 154(b) by 125 days.

This patent is subject to a terminal disclaimer.

(21) Appl. No.: 14/821,129

(22) Filed: Aug. 7, 2015

(65) Prior Publication Data

US 2015/0350751 A1 Dec. 3, 2015

Related U.S. Application Data

(63) Continuation of application No. 14/095,436, filed on Dec. 3, 2013, now Pat. No. 9,133,019.

(51) Int. Cl.
| | |
|---|---|
| *G05B 23/02* | (2006.01) |
| *G06F 13/20* | (2006.01) |
| *H04Q 9/00* | (2006.01) |
| *B81B 7/02* | (2006.01) |

(Continued)

(52) U.S. Cl.
CPC .............. *H04Q 9/00* (2013.01); *B81B 7/02* (2013.01); *G06F 13/4072* (2013.01); *G06F 13/42* (2013.01); *G06F 13/4282* (2013.01)

(58) Field of Classification Search
CPC .. G06F 13/42; G06F 13/4072; G06F 13/4282; H04Q 9/00; G01L 19/148; H04M 2250/12; H04M 2250/14; G05B 19/042; G05B 2219/37468; G05B 2219/37293; G05B 2219/37104; G05B 19/4142

See application file for complete search history.

(56) References Cited

U.S. PATENT DOCUMENTS

| | | | |
|---|---|---|---|
| 5,535,625 A * | 7/1996 | Levy | G01F 23/2963 324/207.13 |
| 5,864,781 A | 1/1999 | White | |

(Continued)

OTHER PUBLICATIONS

NXP Semiconductor, "GPIO I2C or SPI Bus Overview", Jan. 6, 2012 (wayback machine capture), 1 page.

(Continued)

*Primary Examiner* — Firmin Backer
*Assistant Examiner* — Adnan Aziz
(74) *Attorney, Agent, or Firm* — Ohlandt, Greeley, Ruggiero & Perle, L.L.P.

(57) ABSTRACT

Methods of sensing parameters are provided in which an event is detected using one or more microelectromechanical systems (MEMS) sensors of a sensor probe. The event corresponds to a change in a sensed parameter. The detection and associated measurement data is stored in an internal digital storage of the MEMS sensor and an interrupt is transmitted to an upstream device including an identifier of the sensor probe. An interrogation is received from an upstream device responsive to transmitting the interrupt and, responsive to being interrogated by the upstream device, at least the stored detection and associated data are transmitted to the upstream device.

13 Claims, 9 Drawing Sheets

(51) Int. Cl.
*G06F 13/42* (2006.01)
*G06F 13/40* (2006.01)

(56) References Cited

U.S. PATENT DOCUMENTS

| | | | | |
|---|---|---|---|---|
| 5,979,233 | A * | 11/1999 | Johnson | G01F 17/00 73/1.73 |
| 6,023,147 | A * | 2/2000 | Cargin, Jr. | G06F 1/1626 235/375 |
| 6,347,294 | B1 | 2/2002 | Booker et al. | |
| 6,374,079 | B1 | 4/2002 | Hsu | |
| 6,600,962 | B1 * | 7/2003 | Johnson | G05B 19/4142 367/156 |
| 6,842,020 | B2 * | 1/2005 | Slates | G01B 7/003 324/207.12 |
| 7,069,369 | B2 | 6/2006 | Chou et al. | |
| 7,413,129 | B2 | 8/2008 | Fruhauf | |
| 7,446,430 | B2 * | 11/2008 | Leung | H02J 1/08 307/38 |
| 7,526,539 | B1 | 4/2009 | Hsu | |
| 7,627,704 | B2 | 12/2009 | Croyle et al. | |
| 7,684,026 | B2 | 3/2010 | Rogers et al. | |
| 2004/0178930 | A1 * | 9/2004 | Cybulski | G08G 1/02 340/933 |
| 2004/0266480 | A1 | 12/2004 | Hjelt et al. | |
| 2004/0267103 | A1 * | 12/2004 | Li | A61B 5/00 600/323 |
| 2005/0071519 | A1 | 3/2005 | Hart et al. | |
| 2008/0143569 | A1 * | 6/2008 | DuPuis | G01L 19/148 341/143 |
| 2008/0157928 | A1 | 7/2008 | Butler et al. | |
| 2009/0168843 | A1 | 7/2009 | Waters et al. | |
| 2010/0122003 | A1 | 5/2010 | Hu et al. | |
| 2010/0132004 | A1 | 5/2010 | Leung et al. | |
| 2010/0244868 | A1 * | 9/2010 | Cantave | G01R 1/04 324/754.21 |
| 2010/0325326 | A1 | 12/2010 | Huang et al. | |
| 2011/0113171 | A1 | 5/2011 | Radhakrishnan et al. | |
| 2011/0158283 | A1 | 6/2011 | Meyerson et al. | |
| 2012/0019351 | A1 * | 1/2012 | Bougaev | G06F 11/3031 340/3.5 |
| 2012/0072628 | A1 | 3/2012 | Crockett et al. | |
| 2012/0133522 | A1 * | 5/2012 | Giaccherini | G01B 7/023 340/636.1 |
| 2013/0182745 | A1 | 7/2013 | Hertel et al. | |
| 2013/0297225 | A1 * | 11/2013 | Jeffers | G05B 19/042 702/22 |

OTHER PUBLICATIONS

NXP Semiconductor, "PCAL9535A Low voltage 16-big I2C-bus I/O port with interrupt", Sep. 2012, 46 pages.

* cited by examiner

METHODS OF SENSING PARAMETERS

CROSS-REFERENCE TO RELATED APPLICATION

This application is a divisional of U.S. patent application Ser. No. 14/095,436, filed on 3 Dec. 2013, which is incorporated herein by reference.

FIELD OF THE INVENTION

This invention relates to a sensor probe and sensor probe systems, specifically to sensor probes and sensor probe systems used to monitor parameters associated with objects.

BACKGROUND TO THE INVENTION

Sensor probes may be used for measuring parameters such as environmental conditions. The sensor probe may be inserted into an object or fixed in close proximity thereto and can monitor the environmental conditions of the object or to which it is exposed. The sensor probe may be permanently positioned or alternatively they may be temporarily positioned and used only to measure the environmental conditions of the object periodically. Temperature may be one of the most commonly measured parameters by sensor probes. Several types of sensors may be used for measuring temperature, such as thermocouples, thermistors and resistance temperature detectors (RTDs).

Whilst thermocouples, thermistors and RTDs have been used for many years to monitor temperatures, and may well continue to play an important role in industry, there may be emerging applications that require a sensor probe with a suite of sensors and the thermocouples, thermistors and RTDs cannot easily conform. For example, thermocouples, thermistors and RTDs are typically used for measuring temperature and provide a voltage as their output, making them impractical in certain situations.

One particular use of sensor probes is the monitoring of objects being transported. For example sensor probes may be placed in packaging along with the object to be transported. In this manner, environmental conditions to which the object is exposed during transportation may be detected by the probe. This may indicate to entities responsible for the transportation of the object whether or not the object has been exposed to environmental conditions which may be detrimental to the integrity of the object. This is typically done by associating each sensor probe with a monitoring unit which can record measurements provided by the sensor probe and communicate such measurements to the responsible entities via a display screen of the monitoring unit, or a data communication link, or the like.

As objects can be in transportation for prolonged periods of time, sensor probes which consume small amounts of power may be desirable so that battery life of the probe or monitoring unit, where applicable, may be improved. Furthermore, providing a sensor probe and monitoring unit with each object may not be conducive to scalability and may also result in unnecessary cost.

There is accordingly a need for a sensor probe which addresses at least some of the problems identified above.

SUMMARY OF THE INVENTION

In accordance with a first aspect of the invention, there is provided a method of sensing parameters, the method being conducted by a probe sensor system and comprising the steps of:

detecting an event using one or more microelectromechanical systems (MEMS) sensors of a sensor probe, the event corresponding to a change in a sensed parameter;

storing the detection and associated measurement data in an internal digital storage of the MEMS sensor and transmitting an interrupt to an upstream device including an identifier of the sensor probe;

receiving an interrogation from an upstream device responsive to transmitting the interrupt; and, responsive to being interrogated by the upstream device, transmitting at least the stored detection and associated data to the upstream device.

A further feature provides for the method to include receiving electrical power from the upstream device via a power line.

A still further feature provides for transmitting an interrupt to the upstream device to transmit the interrupt via an interrupt line.

A yet further feature provides for transmitting at least the stored detection and associated data to the upstream device to transmit the stored detection and associated data via a data line.

Further features provide for the sensor probe to be connected to the upstream device via a cable and for the upstream device to be one of a remote monitoring unit or a probe hub connected directly to a remote monitoring unit or indirectly to a remote monitoring unit via one or more other probe hubs.

A yet further feature provides for the cable to include a clock line, a data line, a power line, a ground line and an interrupt line.

In accordance with a second aspect of the invention, there is provided a method of monitoring sensing parameters as provided by a probe sensor system, the method being conducted by an upstream device being a remote monitoring unit or a probe hub, and comprising the steps of:

receiving an interrupt from a downstream device being a sensor probe or a probe hub, including an identifier of a sensor probe, the interrupt relating to detecting an event using one or more microelectromechanical systems (MEMS) sensors of the sensor probe;

responsive to receiving the interrupt from the downstream device, interrogating the downstream device; and, receiving, from the downstream device, at least a stored detection and associated data at the upstream device.

A further feature provides for the method to include a step of supplying electrical power to the sensor probe.

A still further feature provides for receiving an interrupt from a downstream device to include receiving the interrupt via an interrupt line.

A yet further feature provides for receiving at least a stored detection and associated data to receive the stored detection and associated data via a data line.

A further feature provides for the method to include a further step of: responsive to receiving at least the stored detection and associated data from the downstream device, if the upstream device is not a remote monitoring device, the upstream device transmitting an interrupt to another device being upstream of the upstream device.

A still further feature provides for the step of interrogating the downstream device to include accessing a register, an access table map, or an up-loadable sensor driver access program of the downstream device.

A yet further feature provides for the method to include:

addressing a sensor probe using a unique probe identifier at a microcontroller of a next downstream probe hub of the probe sensor system;

the next downstream probe hub then checking to ascertain if the addressed sensor probe is connected to itself, and if not, forwarding the unique probe identifier, a sensor identifier and sensor parameters to be programmed into the addressed sensor probe to a next downstream probe hub until an appropriate probe hub is reached; and, a microcontroller of the appropriate probe hub then addressing a digital storage module of the sensor probe and updating one or more sensor parameters of the sensor probe.

DETAILED DESCRIPTION WITH REFERENCE TO THE DRAWINGS

Figure 1:
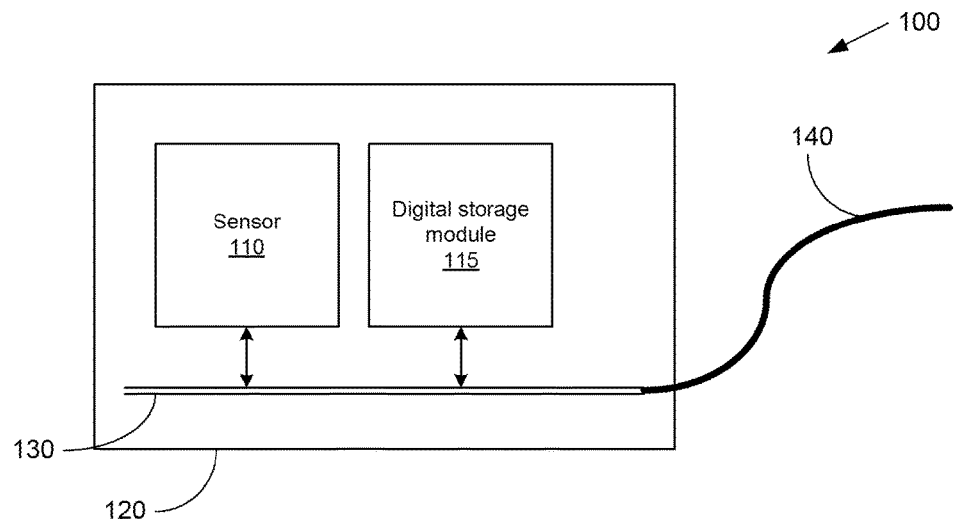
FIG. 1 is a block diagram illustrating components of a sensor probe according to an embodiment of the invention.

Embodiments of the invention are directed at a sensor probe and systems and methods relating thereto. FIG. 1 is a block diagram illustrating components of a sensor probe (100) according to an embodiment of the invention. The sensor probe has one or more microelectromechanical systems (MEMS) sensors (110) which are configured to sense parameters.

The terms MEMS sensors or microelectromechanical systems sensors, as used throughout this specification, are intended to have their broadest possible meaning and may include integrated circuit (IC) sensors and/or IC sensors having a small profile. A MEMS sensor may refer to a sensor IC that is disposed or incorporated onto a printed circuit board (PCB) with an interface to an external microcontroller (MCU), digital storage module such as non-volatile memory and power. The sensor probe according to embodiments of this invention, however, is not provided with an MCU or a power source. Instead, a remote device is provided which contains an MCU which interfaces with the MEMS sensors and provides electrical power via a cable. MEMS sensors may refer to very small ICs that consist of a central unit to process data, and several other components that interact with built-in micro sensors on the IC. MEMS sensors may utilize either a serial peripheral interface (SPI) bus or inter-integrated circuit (I2C) bus to transmit sensor data to an MCU, and MEMS sensors may also require a power line and a 0V ground (GND), as well as appropriate communication protocol data lines.

The parameters sensed by the MEMS sensors (110) may be environmental conditions, situational conditions, physical conditions or the like. For example, the one or more sensors (110) may be any one or more of the group of a temperature sensor; humidity sensor; pressure sensor; movement sensor; vibration sensor; acceleration sensor; light sensor; gas sensor; air-flow sensor; direction sensor; a magnetometer; a gyroscope; an accelerometer; a microphone; a radiation sensor; or the like. At least some of the MEMS sensors may be put into a slow sample state which in some cases may be a sample rate of one sample per second. This may serve as to lower the overall power consumption of the sensor probe or remote monitoring unit. The one or more MEMS sensors (110) are preferably digital interface IC's and are addressable by an identifier, which may be an ID number, on a common bus. The MEMS sensors (110) may have an open collector, or common output pin and may be configured to transmit a signal if an event is detected. The MEMS sensors preferably have limit settings (for example upper or lower limits) that may be monitored internally while a master node or controller is sleeping, and can wake up the master node from sleep when any exception occurs.

The one or more sensors (110) are disposed on a substrate (120) which, in a preferred embodiment is a printed circuit board (PCB). A communication bus (130) is also disposed on the substrate (120) and is in electrical communication with the one or more sensors. In a preferred embodiment of the invention, the communication bus (130) includes a clock line, a data line, a power line and a ground line and may be in the form of copper tracks disposed on the substrate. Further embodiments of the invention provide for the communication bus (130) to be an inter-integrated circuit (I2C) communication bus wherein the clock line is a serial clock line and the data line is a serial data line. Some embodiments of the invention further provide for the communication bus to include an interrupt line.

I2C communication makes use of a two wire communication bus that supports bi-directional data transfer between a master node and several slave nodes, which in this case may be MEMS sensors. The master node controls the I2C communication bus, and in particular a serial clock line (SCL), and synchronizes data transfers over the I2C communication bus. The serial data line (SDA) is used to transfer data between the master and slave nodes. The slave nodes respond to the master node. There can be multiple slave nodes on the I2C communication bus, and normally only one master node. Both slave and master nodes can transfer data over the I2C communication bus. Serial clock and serial data lines from the master node are connected to all devices on the I2C communication bus with pull-up resistors on both lines to the power line. A 0V ground (GND) line as well as an interrupt/wake-up line is also provided. Each slave device has a unique address that is managed by the master node.

The sensor probe (100) further includes a digital storage module (115) in which a unique probe identifier is stored. The digital storage module (115) is in electrical communication with the communication bus (130) and is operable to send and receive data over the communication bus (115). Embodiments of the invention provide for the digital storage module (115) to be an electrically erasable programmable read-only memory (EEPROM) IC and for sensor identifiers corresponding to the one or more MEMS sensors of the probe to be stored in the digital storage module (115). Each sensor identifier may be an address of the corresponding MEMS sensor or a unique identifier. The digital storage module (115) is operable to communicate the unique probe identifier, sensor identifiers and/or register, access table maps, and optional up-loadable sensor driver access program via the communication bus (130). In some embodiments of the invention, the digital storage module (115) is a STMicroelectronics® M24C31 serial I2C bus EEPROM storage module. In some embodiments of the invention, the sensor probe (100) includes an interface which at least includes the digital storage module (115) and at least one sensor.

In some embodiments of the invention, the digital storage module (115) of the sensor probe (100) may have a probe identifier and information relating types of sensors included on the sensor probe (100) and identifiers used for I2C access. The digital storage module (115) may also contain a list of sensor register addresses, register types, such as Status, Command, Data, and bit masks which may be used to isolate events for each sensor (110). This data, or information, is read by an upstream device, for example a remote monitoring unit or a probe hub, and may be loaded into a generic sensor access program which operates on the remote monitoring unit or probe hub, as the case may be, and which may enable the remote monitoring unit or probe hub to program sensors (110) of the sensor probe (100) and read data, such as measurement data, or events from the sensors (110).

In an alternate embodiment, a complete driver, or sensor access program, may be stored in the digital storage module (115) of the sensor probe (100). Such a drive may be similar to, for example a computing device driver such as a Microsoft® Windows® driver, and may be used by an upstream device, for example a remote monitoring unit or a probe hub, to access or address the sensors (115). For example an upstream device may copy the driver from the digital storage module (115) of the sensor probe (100) into its own digital storage and may execute the driver from the digital storage of the upstream device. This may enable a controller of the upstream device to access any future probe sensor or sensor probe (100), for example a sensor probe (100) which is added at a later stage, without performing firmware upgrades on the upstream devices in the field each time a new sensor probe (100) is added to the upstream device. Such a driver, or access parameters or access program, may be loaded by a controller, for example being a microcontroller, of the upstream device when a sensor probe (100) is first detected by the upstream device and may be stored and/or used while the sensor probe (100) is attached to the upstream device.

Once sensor probes are deployed, it would be very difficult for a remote monitoring unit to be able to determine, and work with, sensor parameters if these parameters are not stored on the digital storage module of the sensor probe. Hence, whenever any type of sensor probe is manufactured, it may be provided with its own register, access table map, sensor identifiers and sensor driver access program loaded into the digital storage module. Thus, when any one of our probes are plugged into a probe hub or a remote monitoring unit, the sensor parameters in the digital storage module of the sensor probe may be read by, or up-loaded to, a microcontroller of the hub or remote monitoring unit for processing and executing purposes.

The sensor probe (100) includes a cable (140) which is in electrical communication with the communication bus (130). A first end of the cable (140) is connected to the sensor probe and a second end may be connected to an external device, such as a remote monitoring unit or a hub. Embodiments of the invention provide for the remote monitoring unit or a hub to act as or provide a master node. The cable (140) is configured to provide electrical power and a clock signal received from the external device to the one or more sensors (110) and digital storage module (115), via the communication bus (130), and to communicate data received from the one or more sensors (110) and/or digital storage module (115), via the communication bus (130), to the external device. The cable (140) accordingly extends the communication bus to the external device. Embodiments of the invention provide for the cable to have four wires for each of the serial clock line, the serial data line, the power line and the ground line. Some embodiments of the invention further provide for the cable (140) to include fifth wire for an interrupt line.

In some embodiments of the invention, the one or more sensors (110) and/or digital storage module (115) may be configured to receive electrical power and a clock signal on an intermittent basis. The one or more sensors, responsive to receiving electrical power and a clock signal, may be configured to transmit, via the serial data line, an output corresponding to a sensed parameter. Embodiments of the invention accordingly provide a sensor probe (100) which may be configured to draw small amounts of current which in turn results in a sensor probe (100) which is has low power consumption. In some embodiments of the invention, the sensor probe may draw less than 200 micro Amperes (μA) when operating at room temperature and in a more preferred embodiment may draw current not exceeding 80 μA.

In some embodiments of the invention, the one or more MEMS sensors (110) are configured to detect events, being measurements which lie outside of predefined thresholds, and to record the detection of such events for communication to an external device.

By providing a sensor probe (100) without an MCU, power source and master node, the sensor probe (100) according to embodiments of the invention may be operable to operate at environmental temperatures between −40 and +85 degrees centigrade. More preferably, the sensor probe may be operable to operate at environmental temperatures between −60 and +125 degrees centigrade and even more preferably the sensor probe may be operable to operate at environmental temperatures between −80 and +135 degrees centigrade.

Figure 2:
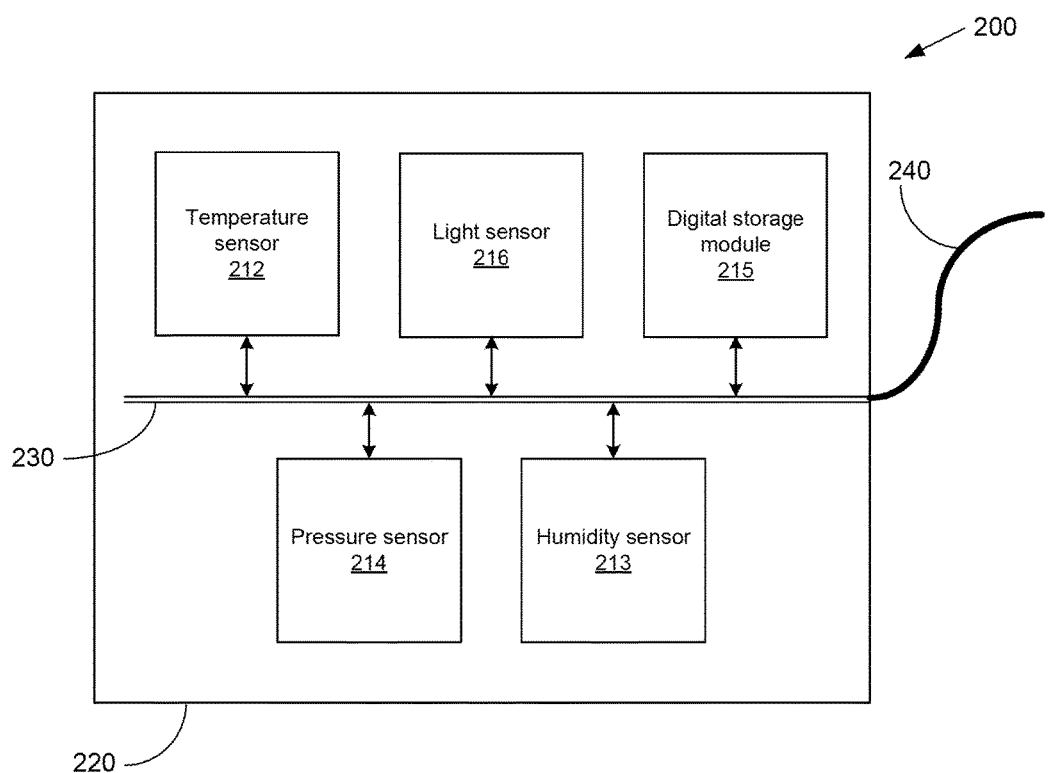
FIG. 2 is a block diagram illustrating components of a sensor probe according to another embodiment of the invention.

FIG. 2 is a block diagram illustrating components of a sensor probe (200) according to another embodiment of the invention. The sensor probe (200) is similar to the sensor probe described above with reference to FIG. 1 and includes four MEMS sensors (212, 213, 214, 216). The MEMS sensors in the illustrated embodiment include a temperature sensor (212), a humidity sensor (213) a pressure sensor (214) and a light sensor (216). Other embodiments of the invention may include more sensors in any of a number of possible combinations. Exemplary temperature sensors include an Analog Devices® ADT7420 temperature sensor or any other appropriate sensor. Exemplary humidity sensors include a Sensirion® SHT21 humidity sensor or any other appropriate humidity sensor. Exemplary pressure sensors include a STMicroelectronics® LPS331AP pressure sensor or any other appropriate pressure sensor. Exemplary light sensors include a Maxim Integrated™ MAX44009 light sensor or any other appropriate light sensor or ambient light sensor. Some embodiments provide for more than one of the same type of sensor to be provided, for example, for two or more light sensors (216) and/or for two or more humidity sensors (213) to be provided.

The sensor probe (200) also includes a digital storage module (215), a communication bus (230), a substrate on which the MEMS sensors (212, 214, 216), digital storage module (215) and communication bus (230) are disposed, and a cable (240). The MEMS sensors (212, 213, 214, 216) and digital storage module (215) are in electrical communication with the communication bus (230). Each one of the MEMS sensors (212, 213, 214, 216) and digital storage module (215) includes a serial data pin, a serial clock pin, a power pin (or V+, VCC pin) and a ground pin (or GND, VSS pin) and are preferably operable to communicate using the I2C communication protocol. Some of the MEMS sensors and/or the digital storage module may further include an interrupt pin. Each respective serial data pin, serial clock pin, power pin and ground pin of the MEMS sensors (212, 213, 214, 216) and digital storage module (215) are in electrical communication with corresponding serial data, serial clock, power and ground wires respectively of the communication bus (230). Thus a common serial data wire, for example, of the communication bus (230) is in electrical communication with each respective serial data pin of the MEMS sensors (212, 213, 214, 216) and digital storage module (215).

Figure 3:
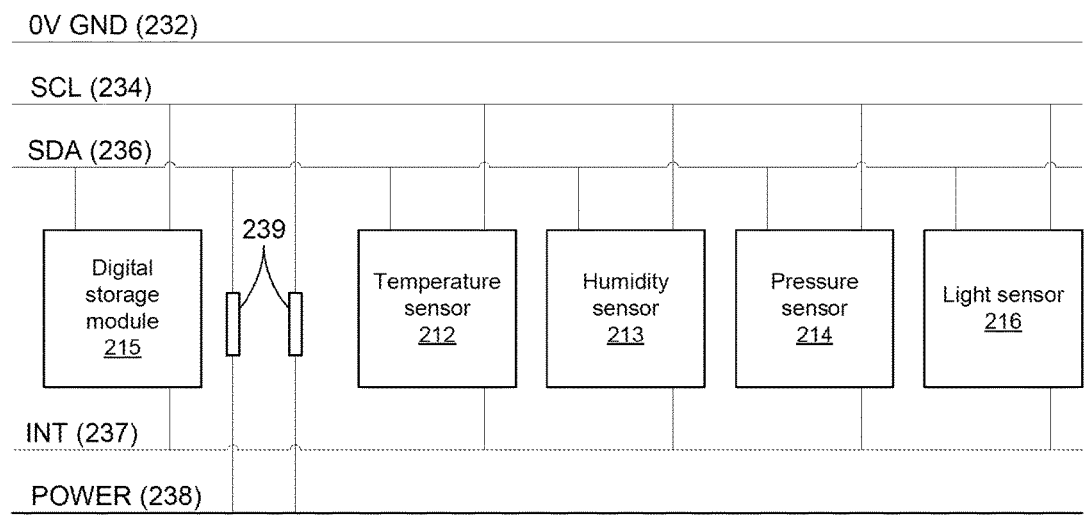
FIG. 3 is a block diagram illustrating components of a sensor probe according to embodiments of the invention.

FIG. 3 is a block diagram in which wires of the communication bus are illustrated. The wires of the communication bus include a serial data wire (236), a serial clock wire (234), a power wire (238), a ground wire (232) and an interrupt wire (237) according to embodiments of the invention. The wires are common to the corresponding serial data, serial clock, power, ground and interrupt pins of the respective MEMS sensors (212, 213, 214, 216).

When the sensor probe is connected to and in electrical communication with the remote monitoring unit, a master node is included electrically and an open-ended circuit is provided which is operable to communicate data using serial clock and serial data lines. Additional MEMS sensor devices can be added to the I2C communication bus if desired or necessary. On both the serial data line (236) and serial clock line (234), there are "pull-up" resistors (239) to the power line. The SDA line remains "high" if the sensor devices are not transmitting. The master node initiates the I2C communication by generating clock signals on the serial clock line.

Figure 4:
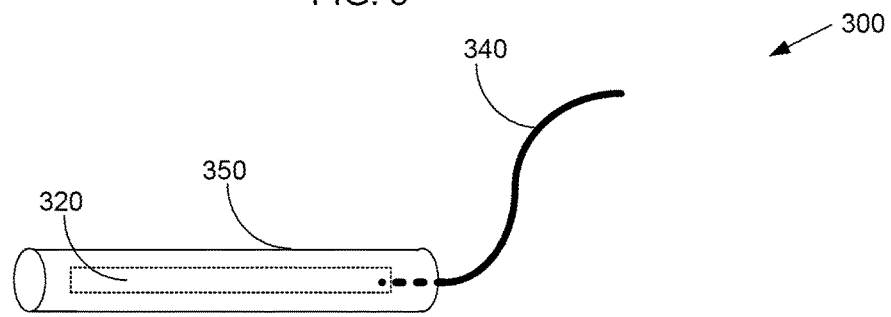
FIG. 4 is a block diagram illustrating a sensor probe according to embodiments of the invention.

FIG. 4 is a block diagram illustrating a sensor probe according to embodiments of the invention in which the sensor probe (300) includes a casing (350) in which the substrate (350), one or more sensors and communication bus and digital storage module may be disposed. The casing (350) is preferably a protective housing which may be cylindrical or tubular in shape and may have an open end and a substantially closed end, the substantially closed end providing an aperture through which the cable (340) may pass. In some embodiments of the invention, the casing may have a closed end and a substantially closed end providing an aperture through which the cable (340) may pass.

For example, where a sensor probe is configured to sense parameters such as humidity and pressure, the housing may have an open end. In such a case, the invention further provides for at least some of the MEMS sensors, digital storage module and at least some of the substrate to be sealed off from the open end of the housing. Where a sensor probe is provided without humidity or pressure MEMS sensors, the open end of the housing may be closed.

Figure 5:
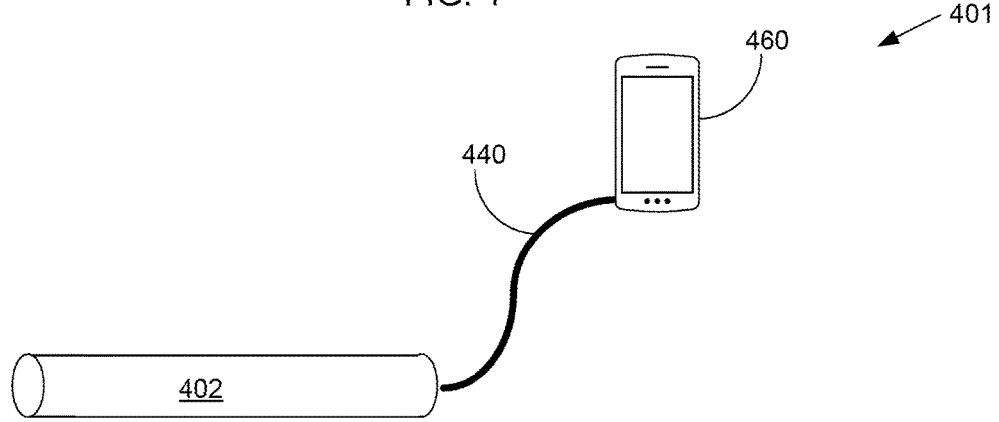
FIG. 5 is a block diagram of a probe sensor system according to embodiments of the invention.

FIG. 5 is a block diagram of a probe sensor system (401) according to embodiments of the invention. The probe sensor system (401) comprises a sensor probe (402) according to embodiments of the invention and a remote monitoring unit (460).

The sensor probe (402) comprises one or more microelectromechanical systems (MEMS) sensors configured to sense parameters and a substrate on which the one or more sensors is disposed. The sensor probe (402) includes a communication bus disposed on the substrate and which is in electrical communication with the one or more sensors as well as a digital storage module in which a unique probe identifier is stored, the digital storage module is in electrical communication with the communication bus. In the illustrated embodiment, the sensor probe includes a casing and a cable (440), a first end of which is connected to and in electrical communication with the communication bus and a second end of which is connected to and in electrical communication with the remote monitoring unit (460). The cable (440) is configured to provide electrical power and a clock signal received from the remote monitoring unit (460) to the one or more sensors, via the communication bus, and to communicate data received from the one or more sensors, via the communication bus, to the remote monitoring unit (460).

Figure 6:
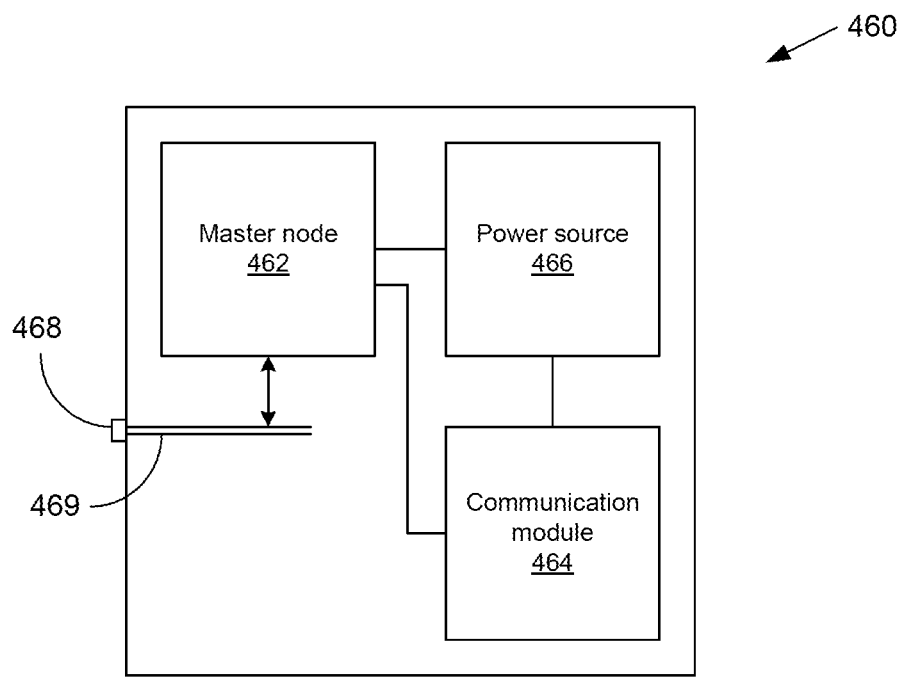
FIG. 6 is a block diagram illustrating components of a remote monitoring unit according to embodiments of the invention.

FIG. 6 is a block diagram which illustrates components the remote monitoring unit (460) of FIG. 5. The remote monitoring unit (460) includes a power source (466) which is configured to provide electrical power to the monitoring unit (460) and the sensor probe (402) via the cable (440). The power source (466) may be a battery, a solar panel, wind turbine or the like or may be an adapter or inverter which receives power from an external power source. The remote monitoring unit (460) also includes a master node (462) which is at least configured to transmit data to, and receive data from, the one or more MEMS sensors or one or more hubs via the cable (440). The received data may at least include information relating to a parameter sensed by the one or more sensors. The master node (462) may be an I2C master node. The remote monitoring unit (460) includes a communication module (464) which is configured to communicate at least the received data to a remote device, for example, remotely accessible gateway or server. Embodiments of the invention provide for the remote monitoring unit (460) to be provided with a communication bus (469), which is preferably an I2C communication bus, and which is in electrical communication with the master node (462) and a communication port (468), or socket, to which the cable (440) may be connected. The cable (440) may be permanently connected to the port (468) or may be provided with a connector configured to be received and held releasably captive by a corresponding assembly of the port (468). The connector may be a 5-pin connector. In some embodiments of the invention, the remote monitoring unit (460) may include an MCU, a non-volatile memory, an antenna, a display screen and any other components or modules which may be required for the remote monitoring unit (460) to perform its functions.

In embodiments of the invention, the master node (462) is configured to generate a clock signal on the serial clock line. The master node (462) is configured to transmit and receive data via the serial data line. The communication bus may be shared by many sensor probes and there is a potential for any sensor probe to have a fault which may cause the communication bus to hang. For example if any sensor on a probe holds the serial data line or serial clock line low, it may prevent the master node from sending START or STOP commands to, for example, reset the communication bus. Thus an interrupt, or reset, line is provided with which the sensors and/or sensor probes may be reset. Alternatively the power line may be cycled which will also reset the sensor probes.

The master node (462) also supplies electrical power to the sensor probes, typically corresponding to a voltage being less than or equal to 3.3V. Each sensor probe and/or MEMS sensor, or peripheral, is referred to as a slave node which is addressed by the master node. A sensor probe can be either a receiver or transmitter of data. Sensor probes according to embodiments of the invention use a wire cable for the serial data and serial clock lines, the reset line, the 0V ground and power line. The serial data and serial clock lines, the reset line, the 0V ground and power line according to various embodiments of the invention may be used to communicate data signals, clock signals, reset/interrupt/wake-up signals, ground signals and power signals respectively.

According to embodiments of the invention, once a sensor probe is plugged into the I2C communication port (468) of the remote monitoring unit (460), and consequently placed in electrical communication with the master node (462), a power pin of the master node (462) supplies a voltage between +2.8V and +3.3V which in turn supplies a voltage to the power line of the communication bus. Being in electrical communication with the communication bus and master node (462), the sensor probe is also supplied with a voltage. The supplied voltage may then power the sensor probe and the master node (462) then initiates a communication link between itself and the sensor probe by utilizing the serial clock line. The master node can identify specific sensor probes from information stored in the digital storage module of the sensor probe.

Figure 7:
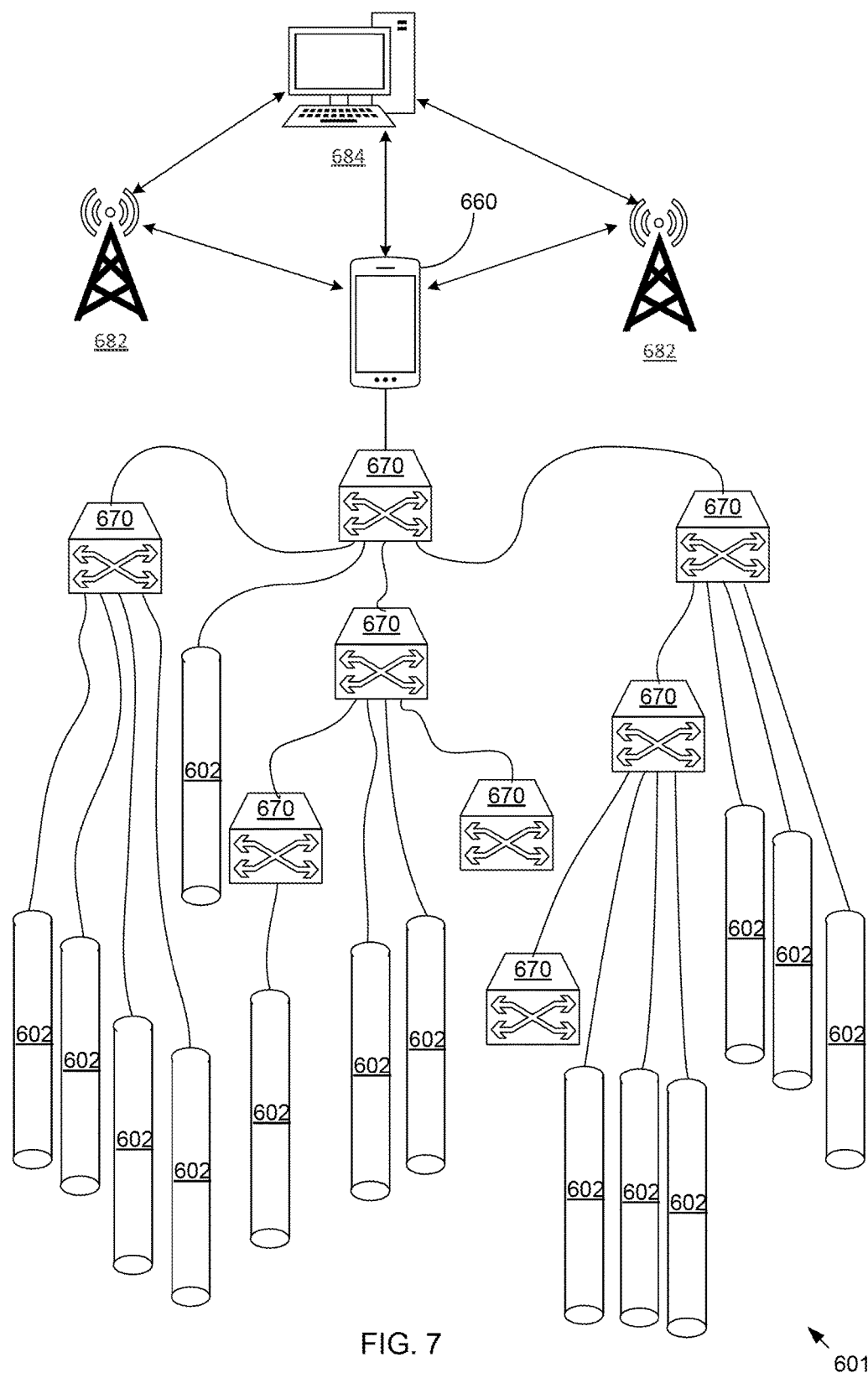
FIG. 7 is a block diagram of a probe sensor system according to embodiments of the invention.

The master node (462) can also communicate with a probe hub, or an appropriate multiplexer, or an I2C hub which may be connected to the communication port (468) of the remote monitoring unit (460). Probe hubs are used for splitting the communication bus into multiple communication bus lines for connecting multiple sensor probes. The probe hubs can also be cascaded to form long probe networks FIG. 7 is a block diagram of another probe sensor system (601) according to embodiments of the invention. The probe sensor system includes one or more sensor probes (602), one or more probe hubs (670), a remote monitoring unit (660), communication networks (682) and a remote server (684) which may be a remotely accessible network gateway or server.

Each one of the one or more sensor probes (602) has one or more microelectromechanical systems (MEMS) sensors configured to sense parameters and a substrate on which the one or more sensors is disposed. A communication bus is disposed on the substrate and is in electrical communication with the one or more sensors. The one or more sensor probes (602) includes a digital storage module in which a unique probe identifier is stored, the digital storage module is in electrical communication with the communication bus. Each of the one or more sensor probes (602) includes a cable, a first end of which is connected to and in electrical communication with the communication bus and a second end of which is connected to and in electrical communication with a probe hub (670). The cable is configured to provide electrical power and a clock signal received from the remote monitoring unit (660), via one or more probe hubs (670), to the one or more sensors, via the communication bus, and to communicate data received from the one or more sensors, via the communication bus, to the remote monitoring unit (660), via one or more probe hubs (670).

The remote monitoring unit (660) has a power source configured to provide electrical power to the monitoring unit (660) and the one or more sensor probes (602) and optionally the probe hubs (670). The remote monitoring unit (660) has a master node which is at least configured to transmit data to, and receive data from, the one or more sensor probes (602) via one or more probe hubs (670), the received data at least including information relating to a parameter sensed by the one or more MEMS sensors. The remote monitoring unit (660) has a communication module configured to communicate at least the received data from one or more sensor probes (602) to a remote server (684). The data may be communicated by periodically directly connecting the remote monitoring unit (660) into the remote server (684) or via one or more communications networks (682) which may include the Internet, Wi-Fi or cellular data networks.

The one or more probe hubs (670) are in electrical communication with the remote monitoring unit (660) via a first probe hub. The one or more probe hubs (670) are cascaded, with the first probe hub being connected to and in electrical communication with the remote monitoring unit and a successive probe hub. In this manner, a chain of connected probe hubs (670) may be formed.

Each one of the one or more probe hubs (670) has one or more sensor probes (602) connected thereto and in electrical communication therewith. Each probe hub (602) has a multiplexer and is operable to multiplex data sent from respective sensor probes (602) to the remote monitoring unit (660) and vice versa.

Figure 8:
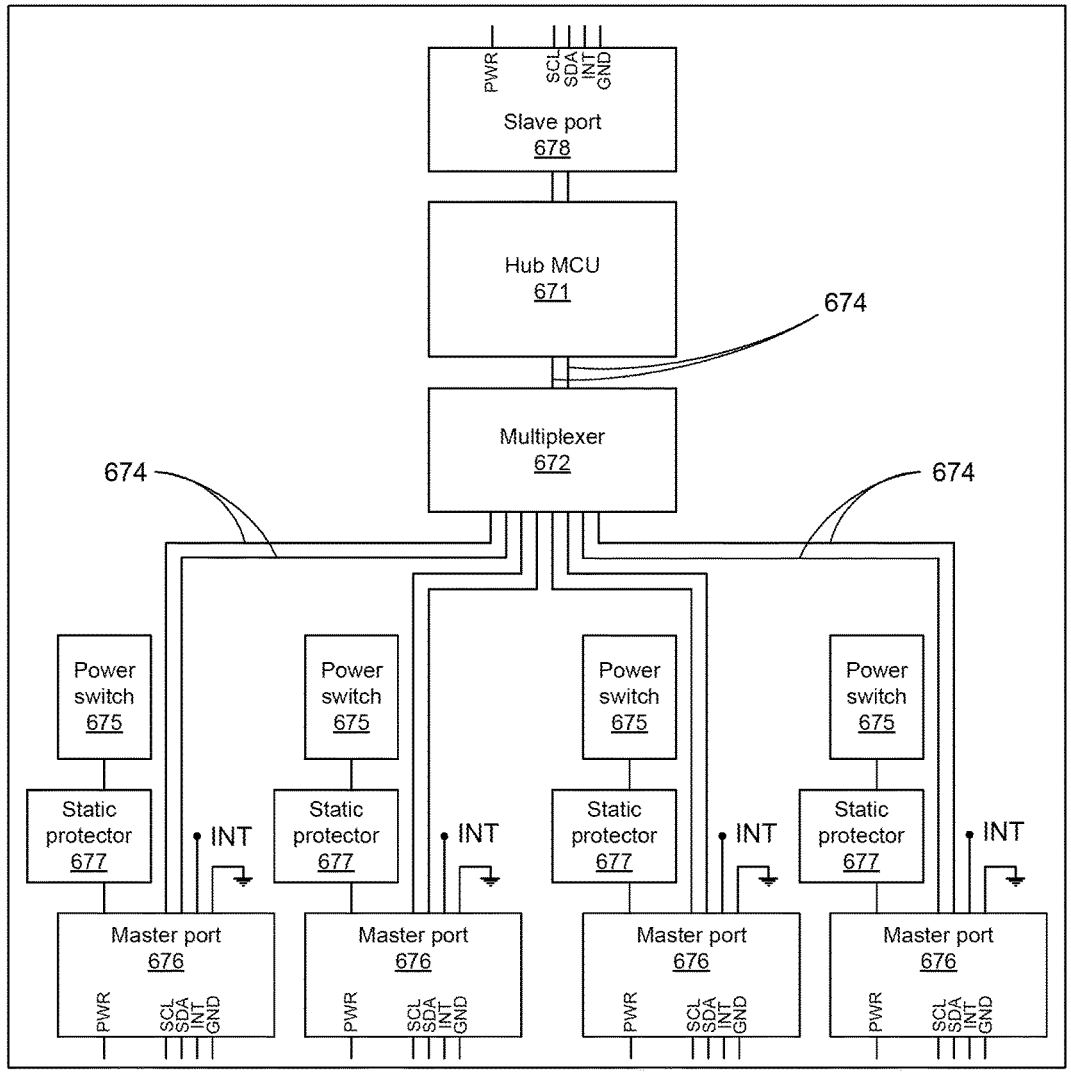
FIG. 8 is a block diagram illustrating components of a probe hub according to embodiments of the invention.

FIG. 8 is a block diagram which illustrates components of a probe hub (670) according to embodiments of the invention. The probe hub (670) includes a multiplexer (672), a hub microcontroller (671), a plurality of communication busses (674) and a plurality of ports (676, 678). The probe hub (670) also includes a plurality of power switches (675) and a plurality of static protectors (677).

The plurality of ports (676, 678) include a plurality of master ports (676) and a slave port (678). The master ports (676) are in electrical communication with the multiplexer (672) such that the probe hub (670) may act as a master node to devices being connected thereto. The slave port (678) is in electrical communication with the hub microcontroller (671) such that the probe hub (670) acts as a slave node to devices connected to the slave port (678). The master ports (676) are connected to the multiplexer via respective communication busses (674). The slave port (678) is connected to the multiplexer (672) via the hub microcontroller (671) and a communication bus (674). The multiplexer (672) is thus operable to multiplex data received at a master port (676) to the slave port (678) via the communication bus (674) and the hub microcontroller (671). Similarly, the multiplexer is operable to demultiplex data received at the slave port (678) to relevant a master port (676).

Cables of sensor probes (602), or of other probe hubs (670), having corresponding connectors, may be connected to the master ports (676) of a probe hub (670). Other probe hubs (670), or the remote monitoring unit (660), having corresponding connectors, may be connected to the slave port (678) of a particular probe hub (670). In this manner, a plurality of sensor probes (602) may be in electrical communication with the remote monitoring unit (660) via one or more probe hubs (670). By connecting another, second probe hub (670) into a particular first probe hub (670), capacity for additional sensor probes may be provided. It is envisaged that a plurality of probe hubs (670) may be cascaded, or connected in a daisy-chain formation, with each probe hub (670) having one or more sensor probes and optionally one or more probe hubs (670) connected thereto and in electrical communication therewith. Embodiments of the invention accordingly anticipate a network of probe hubs, each of which having one or more sensor probes connected thereto and in electrical communication therewith.

Each probe hub (670) is configured to act as a master, or master node, to sensor probes connected thereto via the master ports (676). The same probe hub (670) is in turn configured to act as a slave, or slave node, to another probe hub (670), or to the remote monitoring unit (660), as the case may be, being connected to the slave port (670).

In this manner, a daisy chain of devices may be defined wherein devices being connected to master ports (676) of a particular probe hub (670) are defined as, or considered to be, "downstream" devices whilst devices being connected to a slave port (678) of a particular probe hub (670) are defined as, or considered to be, "upstream" devices. Thus downstream devices of a particular probe hub (670) include all devices which are in electrical communication with that probe hub (670) its master ports (676).

Thus as in the embodiment of the system (601) illustrated in FIG. 7, additional probe hubs (670) may be provided. Each of the additional probe hubs (670) is connected in a daisy-chain formation with a series of additional probe hubs (670) being connected downstream from the probe hub (670). Each one of the downstream probe hubs (670) is in electrical communication with, and acts as a slave to, preceding upstream probe hubs (670) and each upstream probe hub (670) acts as a master to succeeding downstream probe hubs (670). Each probe hub is addressable by a common and programmable unique hub identifier and optionally has one or more sensor probes (602) connected thereto and in electrical communication therewith. The sensor probes (602) similarly act as slaves to the probe hubs (670) to which they are connected. Each slave device, being either a probe hub (670) or a sensor probe (602), is configured to send an interrupt to its master device, being either a probe hub (670) or the remote monitoring unit (660), as the case may be, which may cause the master device to interrogate the slave device and, responsive to which, the slave device is configured to communicate stored detection and associated sensor data to the master.

The hub microcontroller (671) of each probe hub (670) may thus be configured to manage and store multiple interrupts and associated measurement data originating from sensor probes (602) connected thereto and to transmit an interrupt to the remote monitoring unit (660), or an upstream probe hub, as the case may be. The remote monitoring unit (660) or upstream probe hub (670), as the case may be, may in turn be configured to receive an interrupt and, responsive to which, interrogate the downstream probe (670) or sensor probe (602), as the case may be, for stored detections, interrupts and associated measurement data. The downstream probe hub (670) or sensor probe (602), as the case may be, is in turn configured to, responsive an interrogation by the upstream device, communicate stored interrupts and associated sensor data to the upstream device.

The hub microcontroller (671) of each probe hub (670) may use sensor identifier data stored in a digital storage module of each probe hub, such as a register, access table map, and optional up-loadable sensor driver access program, to enable a generic procedure by which the hub microcontroller (671) may read the measurement data and/or sensor identifier data, and store such data in a hub microcontroller memory. The hub microcontroller (671) of each cascaded probe hub (670) may accumulate all data from downstream probe hubs (670) and sensor probes (602). Any type of sensor probe (602), for example having any arrangement and configuration of MEMS sensors, as well as any configuration or arrangement of sensor probes (602) and probe hubs (670) may be connected to a master port (676) of an upstream hub (670). Sensor probes (602) and probe hubs (670) may be "hot inserted" into master ports (676) of an upstream probe hub (660) or the remote monitoring unit (660).

The multiplexer (672) is configured to multiplex, or route, clock signals and/or data signals preferably being I2C clock signals and data signals. For example, the multiplexer (672) may be configured to route a clock signal and a data signal, received from the remote monitoring unit (660), to a particular sensor probe (602). The sensor probe, receiving the clock signal and data signal from the remote monitoring unit via one or probe hubs, may then respond by sending data to the remote monitoring unit. The data sent from the sensor probe is received by the multiplexer (672) which then routes the received data to the remote monitoring unit, optionally via one or more additional probe hubs (670).

The plurality of communication buses (674) may be I2C communication busses and may provide serial clock and serial data lines. In some embodiments, the communication busses (674) may have four or five wires for a clock signal, a data signal, a power signal, a ground signal and optionally an interrupt signal. In some embodiments of the invention, the power and ground signals may be multiplexed, while in other embodiments, the power and ground signals are provided to all sensor probes and probe hubs simultaneously. In some embodiments, electrical power is provided to each master port (676) by a corresponding power switch (675) via a static protector (677). Thus the one or more sensor probes (602), in some embodiments being in communication via an I2C communication bus, of the system (601) may be split into smaller I2C sub-systems by including a probe hub (670) having a multiplexer (672) or I2C hub. Multiplexers or I2C hubs divide the I2C devices into, for example, a 2 sub-system, a 4 sub-system or an 8 sub-system.

The static protectors (677) on each master port (676) may be operable to isolate a power signal, the clock signal and a data signal (e.g. SCL and SDA lines), and also the interrupt, or wake-up, line from the sensor probes.

The probe hub (670) may further be operable to latch each incoming interrupt line from each other, yet being operable to pass a common interrupt to the sensor probe. In embodiments of the invention, the probe hub (670) is operable to isolate each incoming interrupt line from each other and from a common interrupt line going to the sensor probe, in case of a sensor failure in a sensor probe. In some embodiments, the probe hub (670) is configured to limit current drawn by each multiplexed line of sensor probes, and should there be a current overload or short on a particular line, that line is isolated from the other lines. In this manner other, functioning sensor probes may continue to function without being affected by a faulty sensor probe. In some cases this may prevent unnecessary current from being drawn which may help to preserve battery life. It is further anticipated that each sensor hub (670) may be operable to report any faulty sensor probes and/or MEMS sensors, power shorts, line shorts and the like, on a group of sensors while the remainder are kept functional.

In embodiments of the invention, a master node of the remote monitoring unit is operable to identify each sensor probe and/or MEMS sensors of each sensor probe via the digital storage module of each sensor probe. Accordingly received data may be associated with a particular sensor probe and/or a particular sensor by the remote monitoring unit.

In some embodiments, multiple probe hubs may be daisy chained or cascaded in up to 100 ft. increments of up to four probe hubs although it may be the case that more probe hubs may be provided. Each probe hub may connect up to 4 daisy-chained hubs and/or have up to 4 probes connected. Each probe hub has a unique identifier which may make it addressable via the I2C bus.

In some embodiments, the remote monitoring unit may provide more than one port via which sensor probes or probe hubs may be connected. Such embodiments may accordingly cater for dual sensor networks which in some cases may provide redundancy. In some embodiments, such dual sensor networks could be implemented in transportable refrigerators having multiple compartments and wherein the remote monitoring unit is charged periodically. For example, the battery may be charged each time the transportable refrigerators is connected to a tractor. Such implementations may include four probe hubs per port of the remote monitoring unit with each probe hub having three sensor probes and another hub connected thereto.

Figure 9:
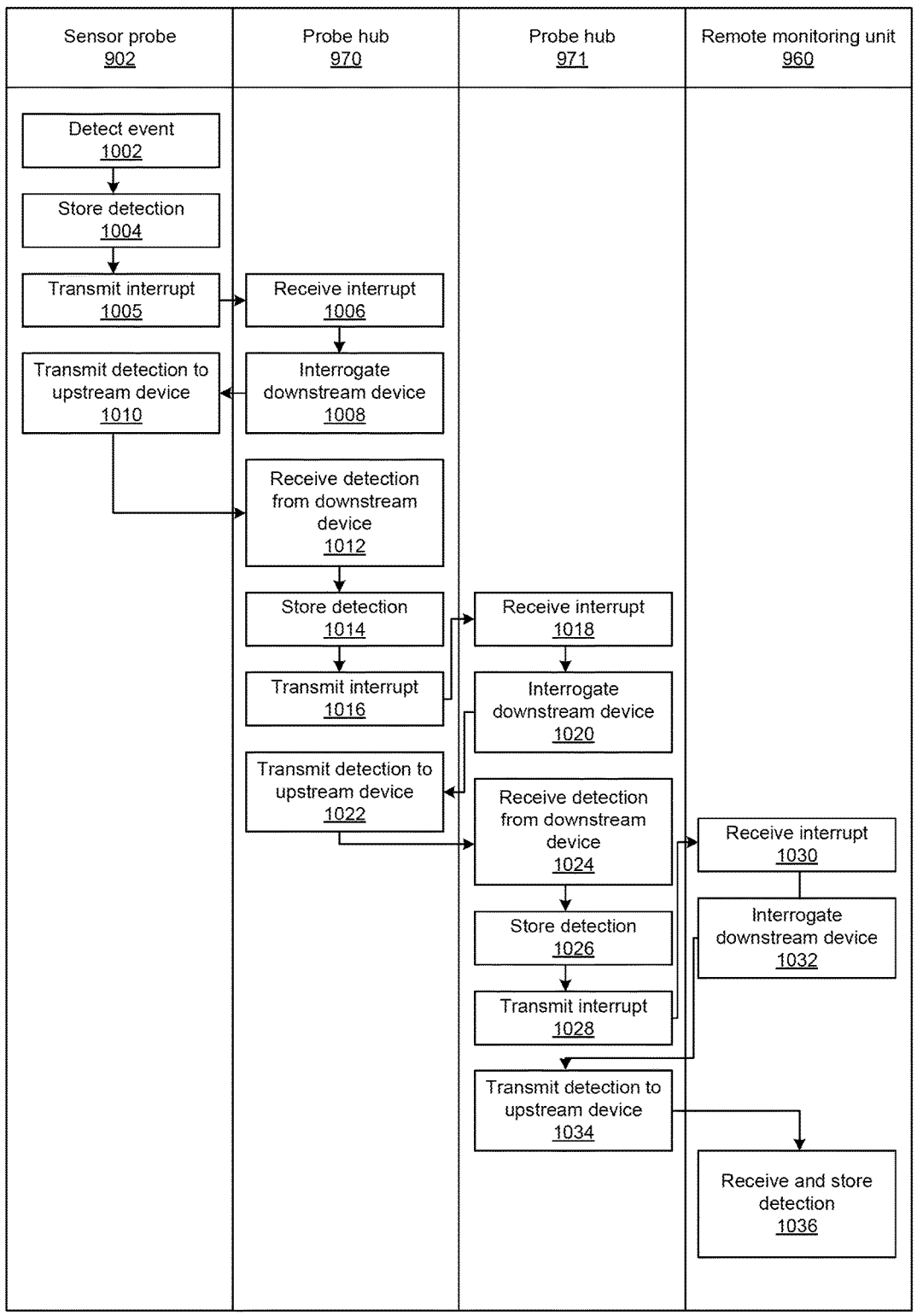
FIG. 9 is a swim-lane flow diagram illustrating methods according to embodiments of the invention.

FIG. 9 is a swim-lane flow diagram which illustrates a method of sensing parameters according to embodiments of the invention. The method is conducted by a probe sensor system. Different swim-lanes in the figure illustrate delineate which steps are performed by respective devices of the system. In the illustrated embodiment, the system includes a sensor probe (902), two probe hubs (970, 971) and a remote monitoring unit (960) according to embodiments of the invention. The devices (902, 970, 971, 960) are connected in a daisy-chain formation as has been previously described in this specification.

The method begins with a first step (1002) of detecting an event using one or more MEMS sensors at the sensor probe (902). The detected event may correspond to a change in a sensed parameter. In a next step (1004), the detection is stored in a digital memory of the MEMS sensor or a digital storage module of the sensor probe (902). In a following step (1005), an interrupt is transmitted to an upstream, or master, device, in the illustrated embodiment being a first probe hub (970).

In a next step (1006), the interrupt is received from the sensor probe (902), being a downstream, or slave device, at the first probe hub (970). Responsive to receiving the interrupt from the sensor probe (902), the first probe hub (970), in a next step (1008), interrogates the sensor probe.

Responsive to interrogation by the first probe hub (970), the sensor probe (902) transmits, in a following step (1010) at least the stored detection and associated measurement data to the first probe hub (970) which in a next step (1012), is received by the first probe hub (970) stored (1014) in a digital memory thereof.

The first probe hub may also be configured to, responsive to receiving the detection from the sensor probe (902), in a next step (1016), transmit an interrupt to another device, being upstream of the first probe hub (970). In the illustrated embodiment, a second probe hub (971) is upstream of first probe hub (971) and acts as a master device, or master node to the downstream, first probe hub (970).

A process similar to what is described above then ensues between the first probe hub (970) and the second probe hub (971) with first probe hub (970) now acting as a downstream device, or slave device, the second probe hub (971) now acting as the upstream, or master, device. Once the interrogation (1020) and transmitting (1022), receiving (1024) and storing (1026) of data between the upstream and downstream devices has occurred, in a manner similar to that described above, the second probe hub (971) may then, acting subsequently as a downstream, or slave, device, transmit (1028) an interrupt to yet another upstream device, in the illustrated embodiment being the remote monitoring unit (960).

Similarly, the remote monitoring unit (960) receives (1030) the interrupt from the downstream device and responsive to which, interrogates (1032) the downstream device being the second probe hub (971). The second probe hub (971) may then transmit (1034) the detection to the remote monitoring unit (960) which receives and stores (1036) the detection.

Figure 10:
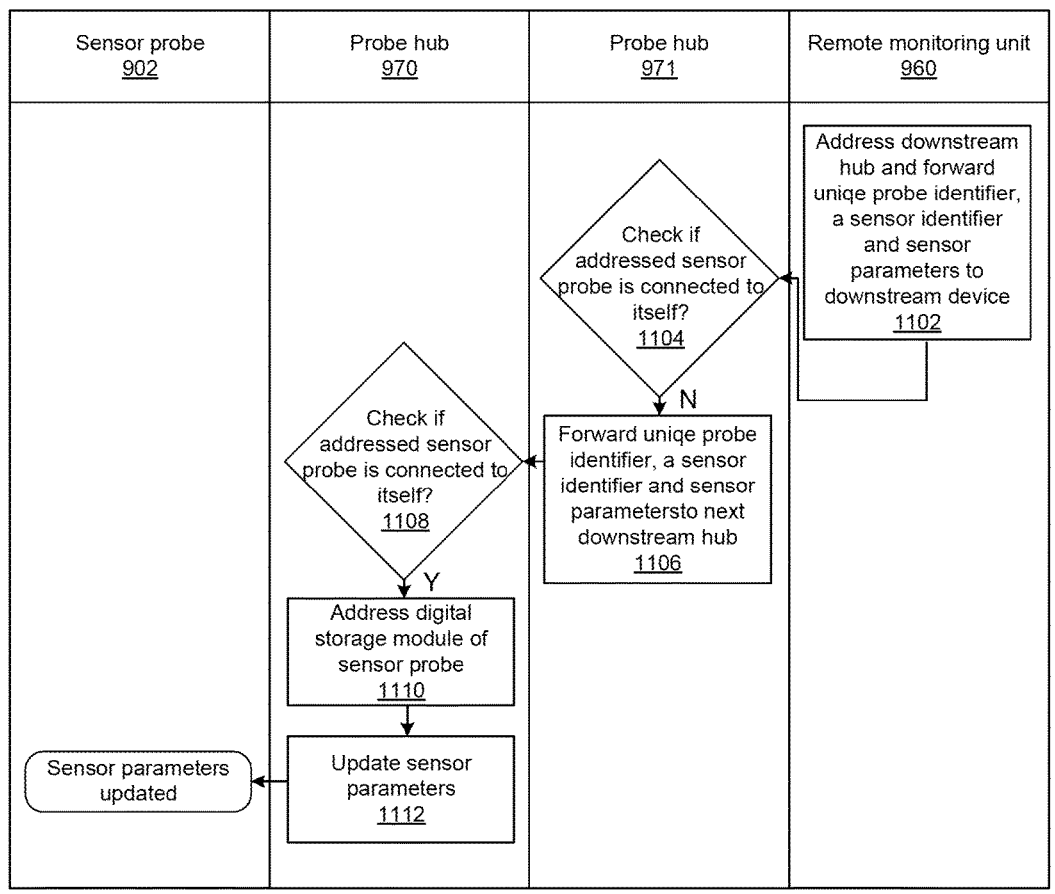
FIG. 10 is a swim-lane flow diagram which illustrates additional steps of the method of sensing parameters described with reference to FIG. 9.

FIG. 10 is a swim-lane flow diagram which illustrates additional steps of the method of sensing parameters described above with reference to FIG. 9. The additional steps of the method relate to programming, or updating, sensing parameters of a sensor probe (902) according to embodiments of the invention. For example the sensor probe may be programmed to detect when a temperature to which the sensor probe (902) is exposed reaches 20 degrees centigrade, or for example when a temperature to which the sensor probe (902) is exposed is outside of a range between −2 and 2 degrees centigrade.

The additional steps of the method may be conducted at a remote monitoring unit (960), or a probe hub (970 or 971). In some embodiments, the sensing parameters of the sensor probe (902) may be updated by via a remote server, such as a computing device, connected to the remote monitoring unit or remotely via the internet or an appropriate database server.

The method includes a first step (1102) of the remote monitoring unit (960) addressing a sensor probe (902) using a unique probe identifier at a microcontroller of a next downstream hub and forwarding the unique probe identifier, a sensor identifier and sensor parameters to be programmed into the addressed sensor probe to the next downstream hub, in the illustrated embodiment being a first probe hub (971) of the sensor probe network. The first probe hub (971), then checks (1104) to ascertain if the addressed sensor probe (902) is connected to itself, and if not, it forwards (1106) the address, which may be the unique probe identifier, a sensor identifier and sensor parameters to be programmed into the addressed sensor probe to the next downstream to the next downstream hub, being a second probe hub (970) in the illustrated embodiment. A microcontroller of the second probe hub (970) similarly checks (1108) to ascertain if the addressed sensor probe (902) is connected to itself. In the illustrated embodiment, the addressed sensor probe (902) is connected to the second sensor hub (970). The microcontroller of the second probe hub (970) then addresses (1110) a digital storage module of the sensor probe (902) and updates (1112) one or more sensor parameters of sensors connected to the sensor probe (902). In alternate embodiments, the address may be forwarded to yet a further downstream device.

The methods described above with reference to FIGS. 9 and 10 are exemplary and both more complicated and simpler systems are anticipated. It may, for example be the case that the system comprises only one sensor probe (970) and one remote monitoring unit (960). It may also be the case that the system comprises a plurality of sensor probes and a plurality of sensor hubs which are daisy chained as has been described in the foregoing description and connected to a remote monitoring unit. It is therefore anticipated that the methods described above may be implemented, mutatis mutandis, in any one of a variety of configurations of sensor probes and probe hubs with probe hubs acting as master nodes or devices to downstream hubs and slave nodes or devices to upstream hubs.

Embodiments of the invention relate to sensor probes, more particularly to a sensor probe that can contain a single, or multiple MEMS sensors wherein each sensor may be configured to sense different parameters. One or more MEMS sensors are incorporated onto a PCB that also includes an EEPROM IC, all of which are enclosed in a probe housing, which is preferably of a generally of tubular shape. In preferred embodiments, the sensor probe uses an I2C communication protocol to transmit sensor data via a cable to a remote monitoring unit. Embodiments of the invention further provide a probe hub, preferably being an I2C hub, into which several sensor probes can be plugged via a cable. Furthermore, a second probe hub also be plugged into the first probe hub, and optionally a third probe hub into the second probe hub, and so on, so that a chain of cascaded probe hubs may be formed with each probe hub having one or more sensor probes in electrical communication therewith. The first probe hub may then be connected to and in electrical communication with a remote monitoring unit. As each probe hub, and each sensor probe is uniquely identifiable and addressable, the monitoring unit may discern from which sensor probe, and more specifically from which sensor on that sensor probe a particular measurement relates. may further have to a remote monitoring unit. Therefore it is possible for a remote monitoring unit with only a single I2C communication port to receive sensor data via the I2C Hub from multiple multi-function sensor probes.

Figure 11:
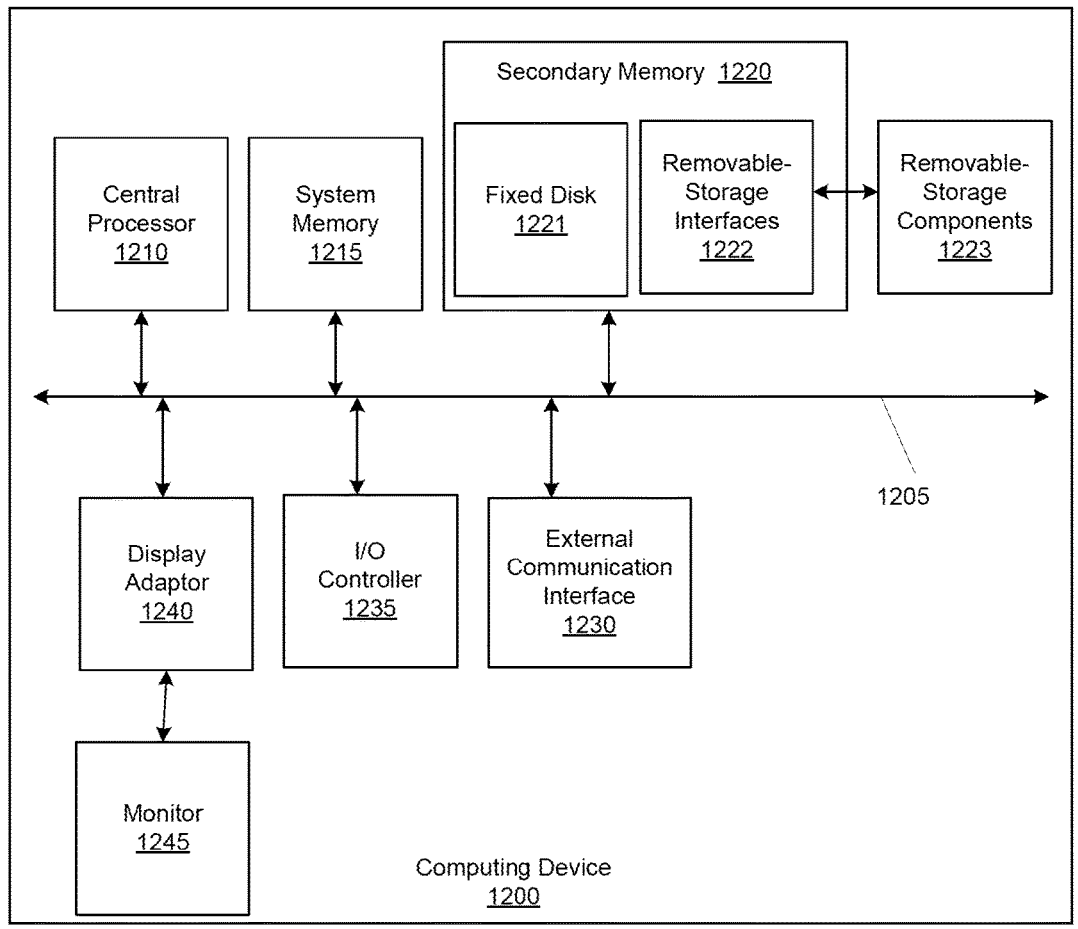
FIG. 11 illustrates an example of a computing device in which various aspects of the disclosure may be implemented; and, FIG. 12 shows a block diagram of a communication device that may be used in embodiments of the disclosure.

FIG. 11 illustrates an example of a computing device (1200) in which various aspects of the disclosure may be implemented. The computing device (1200) may be suitable for storing and executing computer program code. The various participants and elements in the previously described system diagrams may use any suitable number of subsystems or components of the computing device (1200) to facilitate the functions described herein.

The computing device (1200) may include subsystems or components interconnected via a communication infrastructure (1205) (for example, a communications bus, a crossover bar device, or a network). The computing device (1200) may include at least one central processor (1210) and at least one memory component in the form of computer-readable media.

The memory components may include system memory (1215), which may include read only memory (ROM) and random access memory (RAM). A basic input/output system (BIOS) may be stored in ROM. System software may be stored in the system memory (1215) including operating system software.

The memory components may also include secondary memory (1220). The secondary memory (1220) may include a fixed disk (1221), such as a hard disk drive, and, optionally, one or more removable-storage interfaces (1222) for removable-storage components (1223).

The removable-storage interfaces (1222) may be in the form of removable-storage drives (for example, magnetic tape drives, optical disk drives, floppy disk drives, etc.) for corresponding removable storage-components (for example, a magnetic tape, an optical disk, a floppy disk, etc.), which may be written to and read by the removable-storage drive.

The removable-storage interfaces (1222) may also be in the form of ports or sockets for interfacing with other forms of removable-storage components (1223) such as a flash memory drive, external hard drive, or removable memory chip, etc.

The computing device (1200) may include an external communications interface (1230) for operation of the computing device (1200) in a networked environment enabling transfer of data between multiple computing devices (1200). Data transferred via the external communications interface (1230) may be in the form of signals, which may be electronic, electromagnetic, optical, radio, or other types of signal.

The external communications interface (1230) may enable communication of data between the computing device (1200) and other computing devices including servers and external storage facilities. Web services may be accessible by the computing device (1200) via the communications interface (1230).

The external communications interface (1230) may also enable other forms of communication to and from the computing device (1200) including, voice communication, near field communication, Bluetooth, etc.

The computer-readable media in the form of the various memory components may provide storage of computer-executable instructions, data structures, program modules, and other data. A computer program product may be provided by a computer-readable medium having stored computer-readable program code executable by the central processor (1210).

A computer program product may be provided by a non-transient computer-readable medium, or may be provided via a signal or other transient means via the communications interface (1230).

Interconnection via the communication infrastructure (1205) allows a central processor (1210) to communicate with each subsystem or component and to control the execution of instructions from the memory components, as well as the exchange of information between subsystems or components.

Peripherals (such as printers, scanners, cameras, or the like) and input/output (I/O) devices (such as a mouse, touchpad, keyboard, microphone, joystick, or the like) may couple to the computing device (1200) either directly or via an I/O controller (1235). These components may be connected to the computing device (1200) by any number of means known in the art, such as a serial port.

One or more monitors (1245) may be coupled via a display or video adapter (1240) to the computing device (1200).

Figure 12:
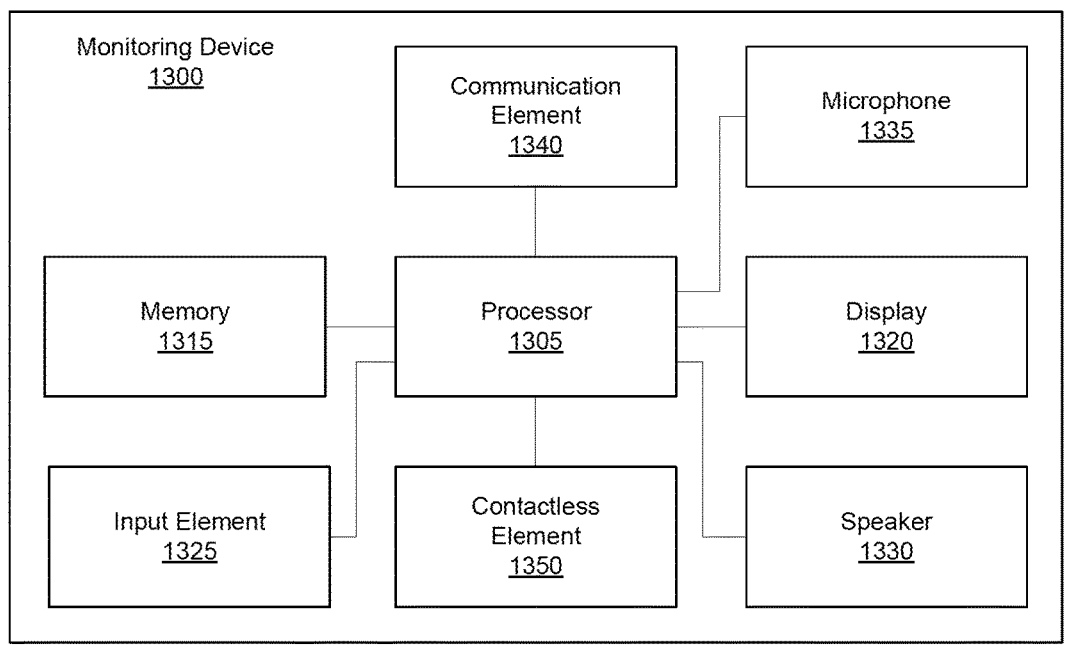

FIG. 12 shows a block diagram of a communication device (1300) that may be used in embodiments of the disclosure. The communication device (1300) may be a cell phone, a feature phone, a smart phone, a satellite phone, or a computing device having a phone capability.

The communication device (1300) may include a processor (1305) (e.g., a microprocessor) for processing the functions of the communication device (1300) and a display (1320) to allow a user to see the phone numbers and other information and messages. The communication device (1300) may further include an input element (1325) to allow a user to input information into the device (e.g., input buttons, touch screen, etc.), a speaker (1330) to allow the user to hear voice communication, music, etc., and a microphone (1335) to allow the user to transmit his or her voice through the communication device (1300).

The processor (1310) of the communication device (1300) may connect to a memory (1315). The memory (1315) may be in the form of a computer-readable medium that stores data and, optionally, computer-executable instructions.

The communication device (1300) may also include a communication element (1340) for connection to communication channels (e.g., a cellular telephone network, data transmission network, Wi-Fi network, satellite-phone network, Internet network, Satellite Internet Network, etc.). The communication element (1340) may include an associated wireless transfer element, such as an antenna.

The communication element (1340) may include a subscriber identity module (SIM) in the form of an integrated circuit that stores an international mobile subscriber identity and the related key used to identify and authenticate a subscriber using the communication device (1300). One or more subscriber identity modules may be removable from the communication device (1300) or embedded in the communication device (1300).

The communication device (1300) may further include a contactless element (1350), which is typically implemented in the form of a semiconductor chip (or other data storage element) with an associated wireless transfer element, such as an antenna. The contactless element (1350) may be associated with (e.g., embedded within) the communication device (1300) and data or control instructions transmitted via a cellular network may be applied to the contactless element (1350) by means of a contactless element interface (not shown). The contactless element interface may function to permit the exchange of data and/or control instructions between mobile device circuitry (and hence the cellular network) and the contactless element (1350).

The contactless element (1350) may be capable of transferring and receiving data using a near field communications (NFC) capability (or near field communications medium) typically in accordance with a standardized protocol or data transfer mechanism (e.g., ISO 14443/NFC). Near field communications capability is a short-range communications capability, such as radio-frequency identification (RFID), Bluetooth, infra-red, or other data transfer capability that can be used to exchange data between the communication device (1300) and an interrogation device. Thus, the communication device (1300) may be capable of communicating and transferring data and/or control instructions via both a cellular network and near field communications capability.

The data stored in the memory (1315) may include: operation data relating to the operation of the communication device (1300), personal data (e.g., name, date of birth, identification number, etc.), financial data (e.g., bank account information, a bank identification number (BIN), credit or debit card number information, account balance information, expiration date, loyalty provider account numbers, etc.), transit information (e.g., as in a subway or train pass), access information (e.g., as in access badges), etc. A user may transmit this data from the communication device (1300) to selected receivers.

The communication device (1300) may be, amongst other things, a notification device that can receive alert messages and access reports, a portable merchant device that can be used to transmit control data identifying a discount to be applied, as well as a portable consumer device that can be used to make payments.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. The described operations may be embodied in software, firmware, hardware, or any combinations thereof.

The software components or functions described in this application may be implemented as software code to be executed by one or more processors using any suitable computer language such as, for example, Java, C++, or Perl using, for example, conventional or object-oriented techniques. The software code may be stored as a series of instructions, or commands on a non-transitory computer-readable medium, such as a random access memory (RAM), a read-only memory (ROM), a magnetic medium such as a hard-drive or a floppy disk, or an optical medium such as a CD-ROM. Any such computer-readable medium may also reside on or within a single computational apparatus, and may be present on or within different computational apparatuses within a system or network.

Any of the steps, operations, or processes described herein may be performed or implemented with one or more hardware or software modules, alone or in combination with other devices. In one embodiment, a software module is implemented with a computer program product comprising a non-transient computer-readable medium containing computer program code, which can be executed by a computer processor for performing any or all of the steps, operations, or processes described.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

The invention claimed is:

1. A method of monitoring sensing parameters as provided by a probe sensor system including a probe hub connected via respective cables to an upstream device and one or more downstream devices, at least one of the one or more downstream devices being a sensor probe, the method conducted at the sensor probe comprising:

detecting an event using one or more microelectromechanical systems (MEMS) sensors of the sensor probe, the event corresponding to a change in a sensed parameter;

storing the detection and associated measurement data in an internal digital storage of the MEMS sensor;

transmitting an interrupt to the probe hub via an interrupt line extending between the sensor probe and the probe hub, the interrupt relating to detecting the event;

receiving an interrogation from the probe hub responsive to transmitting the interrupt; and, responsive to being interrogated by the probe hub, transmitting, via a data line extending between the sensor probe and the probe hub, at least the stored detection, an identifier of the sensor probe and associated measurement data to the probe hub for storage thereat and transmission of an interrupt to the upstream device via an interrupt line extending between the probe hub and the upstream device.

2. The method according to claim 1, wherein the method includes receiving electrical power from the probe hub via a power line extending between the probe hub and the sensor probe.

3. The method according to claim 1, wherein each of the cables includes a wire for each of a clock line, a data line, a power line, a ground line and an interrupt line.

4. A method of monitoring sensing parameters as provided by a probe sensor system including a probe hub connected via respective cables to an upstream device and one or more downstream devices, each of the one or more downstream devices being associated with a sensor probe, the method conducted by the probe hub comprising:
   receiving an interrupt from one of the one or more downstream devices, the interrupt being received via an interrupt line extending between the downstream device and the probe hub and relating to detecting an event using one or more microelectromechanical systems (MEMS) sensors of the sensor probe associated with the downstream device;
   responsive to receiving the interrupt from the downstream device, interrogating the downstream device;
   receiving, from the downstream device via a data line extending between the downstream device and the probe hub, at least a stored detection, an identifier of the sensor probe and associated measurement data;
   storing the detection, sensor probe identifier and associated measurement data; and
   transmitting an interrupt to the upstream device via an interrupt line extending between the probe hub and the upstream device.

5. The method according to claim 4, including:
   receiving electrical power from the upstream device via a power line extending between the probe hub and the upstream device; and
   supplying electrical power to the one or more downstream devices via power lines extending between the probe hub and each of the one or more downstream devices.

6. The method according to claim 4, wherein interrogating the downstream device includes accessing a register, an access table map, or an up-loadable sensor driver access program of the downstream device.

7. The method according to claim 4, including:
   addressing a sensor probe using a unique probe identifier at a microcontroller of a next downstream probe hub of the probe sensor system;
   the next downstream probe hub then checking to ascertain if the addressed sensor probe is connected to itself, and if not, forwarding the unique probe identifier, a sensor identifier and sensor parameters to be programmed into the addressed sensor probe to a next downstream probe hub until an appropriate probe hub is reached; and,
   a microcontroller of the appropriate probe hub then addressing a digital storage module of the sensor probe and updating one or more sensor parameters of the sensor probe.

8. The method according to claim 4, wherein each of the one or more downstream devices is one of: a sensor probe; or, a further probe hub connected via respective cables to one or more sensor probes or further probe hubs, and wherein the upstream device includes: a remote monitoring unit; or, a further probe hub connected directly to the remote monitoring unit via a cable or indirectly to the remote monitoring unit via one or more further probe hubs and cables.

9. The method according to claim 4, including accumulating data from the one or more downstream devices.

10. The method according to claim 8, wherein at least one of the one or more downstream devices is a sensor probe, and wherein the method includes:
    reading data including one or more of: sensor register addresses, register types, and bit masks usable in isolating events for each MEMS sensor of the sensor probe; and,
    loading the data into a generic sensor access program which operates on the probe hub and enables the probe hub to configure the MEMS sensors of the sensor probe and to read data from the MEMS sensors of the sensor probe.

11. The method according to claim 6, including, using one or more of:
    the register; access table map; and, up-loadable sensor driver access program to enable a generic procedure by which the probe hub reads and stores data.

12. The method according to claim 4 including:
    receiving an interrogation from the upstream device responsive to transmitting the interrupt; and,
    responsive to being interrogated by the upstream device, transmitting at least the stored detection, sensor probe identifier and associated measurement data to the upstream device via a data line extending between the probe hub and the upstream device.

13. The method according to claim 4, wherein each of the cables includes a wire for each of a clock line, a data line, a power line, a ground line and an interrupt line.

* * * * *

UNITED STATES PATENT AND TRADEMARK OFFICE
CERTIFICATE OF CORRECTION

PATENT NO. : 9,942,629 B2
APPLICATION NO. : 14/821129
DATED : April 10, 2018
INVENTOR(S) : McCleland et al.

It is certified that error appears in the above-identified patent and that said Letters Patent is hereby corrected as shown below:

On the Title Page

Under "Related U.S. Application Data", item (63) - please correct:
"Continuation of application No. 14/095,436"
To:
-- Divisional of application No. 14/095,436 --.

Signed and Sealed this
Tenth Day of July, 2018

Andrei Iancu
*Director of the United States Patent and Trademark Office*